United States Patent
Ramanadin

[11] Patent Number: 6,091,664
[45] Date of Patent: Jul. 18, 2000

[54] ELEMENTARY STORAGE CIRCUITS

[75] Inventor: Bernard Ramanadin, Palo Alto, Calif.

[73] Assignee: STMicroelectronics S.A., Gentilly, France

[21] Appl. No.: 09/325,139

[22] Filed: Jun. 3, 1999

[30] Foreign Application Priority Data

Jun. 12, 1998 [FR] France ................................. 98 07538

[51] Int. Cl.⁷ ....................................... G11C 8/00
[52] U.S. Cl. ................... 365/233; 365/189.08; 365/194; 365/154
[58] Field of Search ..................... 365/233, 154, 365/189.08, 194; 327/165, 166

[56] References Cited

U.S. PATENT DOCUMENTS

| | | | |
|---|---|---|---|
| 4,878,200 | 10/1989 | Asghar et al. ...................... | 365/189.08 |
| 5,654,934 | 8/1997 | Ohno ...................................... | 365/233 |
| 5,864,250 | 1/1999 | Deng ...................................... | 327/165 |
| 5,910,742 | 6/1999 | Snyder et al. ......................... | 327/165 |

FOREIGN PATENT DOCUMENTS 0 708 408 A2  10/1995  European Pat. Off. .
94 23388  3/1993  WIPO .

*Primary Examiner*—Huan Hoang
*Attorney, Agent, or Firm*—Theodore E. Galanthay; Allen, Dyer, Doppelt, Milbrath & Gilchrist, P.A.

[57] ABSTRACT

A substitution circuit for elementary flip-flop circuits is provided to enable the automatic transposition of a flip-flop circuit whose clock signal comes from a combinational logic circuit. To do this, an over-sampled internal clock signal is used along with a synchronous pulse generator to validate the data.

24 Claims, 2 Drawing Sheets

ELEMENTARY STORAGE CIRCUITS

FIELD OF THE INVENTION

The invention relates to an elementary storage circuit. More particularly, the invention relates to a substitution circuit for elementary flip-flop circuits.

BACKGROUND OF THE INVENTION

The development and production of an integrated circuit is relatively lengthy and costly. The technologies used for the manufacture of integrated circuits currently change every eighteen months. These circuits are generally used as library circuits for the design of bigger circuits. For complex circuits, such as microprocessors, a transposition of the circuit is necessary to make the circuit compatible with the new technology.

Furthermore, when carrying out the logic simulation of a complex circuit, logic emulators based on programmable components are used. These logic emulators enable the logic functions of a circuit to be tested at higher speed than with a computer simulation. They are generally used to simulate the complete circuit after each part has been successfully simulated by computer. The logic diagram of the circuit to be simulated is then transposed to the logic emulator.

There has been considerable progress in designing methods in the field of microelectronics. At present, the synchronous type circuits use a general clock for the entire integrated circuit. Furthermore, the clock signals are conveyed directly to the inputs of flip-flop circuits which need clock signals. These rules exist to simplify the designing of the circuits whose complexity is constantly increasing.

Since the former designing methods did not encounter the same constraints, those skilled in the art were led to use combinational logic circuits on clock signals to reduce the size of the circuits. A problem of glitches was taken into account and the combinational circuit was made so that these glitches would be absorbed. The glitches are absorbed by considering the positions of the logic gates with respect to each other when evaluating the propagation time of all the gates. In certain cases, this was also done by assessing the different delays that the signals could have at the input of the combinational logic circuit.

FIG. 1 shows a conventional D type flip-flop circuit 1 having its clock signal input connected to an output of a combinational logic circuit 2. The combinational logic circuit has five inputs, three of the inputs receiving state signals C1 to C3 and the other two inputs receiving two clock signals H1 and H2. The signal present at the output of the combinational logic circuit 2 corresponds to the result of a logic function that combines all the input signals. However, this combinational logic circuit 2 is designed to account for the different propagation times of the elements that form it to avoid having glitches that could affect the flip-flop circuit 1.

Those skilled in the art know that direct transposition of a circuit into new technology may not work. It is therefore necessary to transpose the circuit of FIG. 1 as indicated in FIG. 2. The drawing of FIG. 2 has a multiplexer 3 with two data inputs, one selection input and one output. The first input of the multiplexer 3 receives the data to be memorized or stored. The second input of the multiplexer 3 is connected to the output of the flip-flop circuit 1. The selection input of the multiplexer 3 is connected to the output of the combinational logic circuit 2. The output of the multiplexer 3 is connected to the data input of the flip-flop circuit 1. The clock signal H1 (if the clock signal H1 is the fastest) is connected to the clock signal input of the flip-flop circuit 1. The multiplexer 3 and the flip-flop circuit 1 correspond to a D type flip-flop circuit with data validation input. The input of the flip-flop circuit is validated during an active edge of the clock signal when the output of the combinational logic circuit is active.

However, in certain cases, a transposition of this kind is not appropriate because of various reasons. If, in the original circuit, the clock signals are combined with one another to form a pulse, the pulse may not overlap an active edge of the chosen clock signal. Also, one clock signal may be stopped when another one is active. A clock signal may have a variable frequency. This means that it is not possible to determine which clock must be used to synchronize the flip-flop circuit 1. Other problems may also arise.

The only approach currently available to those skilled in the art is to remake a part of the circuit. However, the reason the circuit is being transposed is precisely to avoid having to make it again. It would be all the more troublesome if it is in the transposition of the circuit to a logic emulator that the problem arises, when computer logic simulations have shown that the concerned circuit works well.

SUMMARY OF THE INVENTION

It is an object of the invention to provide a substitution circuit for the elementary flip-flop circuits so as to allow the automatic transposition of a flip-flop circuit whose clock signal comes from a combinational logic circuit. To do so, the invention uses an over-sampled clock signal and a synchronous pulse generator to validate the data.

The invention includes a defined type flip-flop emulation circuit having a data input, a data output and a clock signal input. The emulation circuit stores data relating to a signal present at the data input during an active edge of a signal present at the clock signal input. The emulation circuit comprises a clock signal generator that produces an internal clock signal, and a synchronous pulse generator that produces a pulse during a period of the internal clock signal whenever an active edge occurs on the signal received by the clock signal input. Also, the emulation circuit includes a defined type flip-flop circuit having a validation input to validate the signal present at the data input with the validation input being connected to the pulse generator to validate the data input during a pulse of the internal clock signal.

BRIEF DESCRIPTION OF THE DRAWINGS

The invention will be understood more clearly and other particular features and advantages will appear from the following description, made with reference to the appended drawings, of which.

DETAILED DESCRIPTION OF THE PREFERRED EMBODIMENTS

Figure 1:
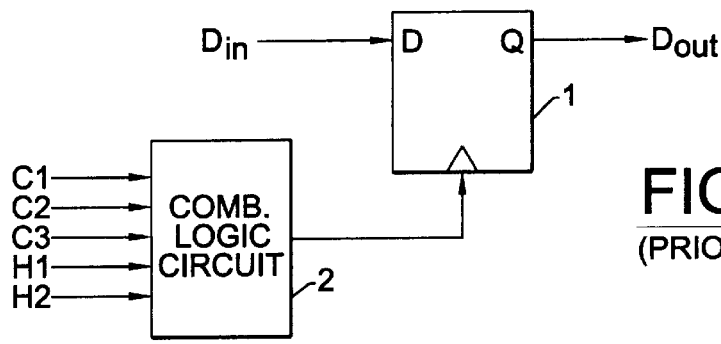
FIG. 1 is a diagram illustrating the use of the flip-flop circuit according to the prior art.
Figure 3:
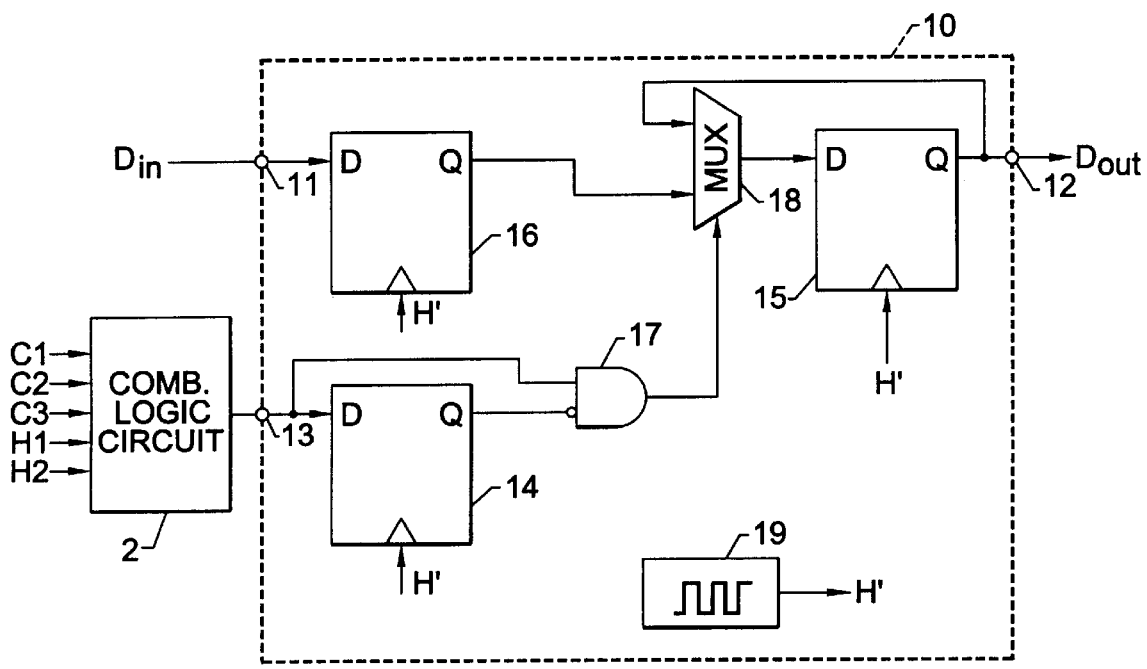
FIG. 3 is a diagram of the substitution flip-flop circuit according to the invention.

FIG. 3 corresponds to the circuit of FIG. 1 in which the flip-flop circuit 1 is replaced by a flip-flop emulation circuit 10. In the example described, the flip-flop circuit 1 is a D type flip-flop circuit well known to those skilled in the art. Thus, the flip-flop emulation circuit 10 has a data input terminal 11, a data output terminal 12 and a clock input terminal 13. The clock input terminal 13 receives the signal coming from the combinational logic circuit 2. The emulation circuit further comprises first to third D type flip-flop circuits 14 to 16, each having a data input, a data output and a clock signal input, and an AND gate 17 having an inverter input, a non-inverter input and an output. Also, the emulator circuit includes a multiplexer 18 having two data inputs, one selection input and one output, and a clock signal generator 19 that gives a clock signal generator H' at an output.

The clock signal inputs of the first to third flip-flop circuits 14 to 16 are connected to the output of the generator 19. The data input of the first flip-flop circuit 14 and the non-inverter input of the gate 17 are connected to the clock signal input terminal 13. The inverter input of the gate 17 is connected to the output of the first flip-flop circuit 14. The data input of the second flip-flop circuit 15 is connected to the output of the multiplexer 18. A first data input of the multiplexer 18 and the output terminal 12 are connected to the output of the second flip-flop circuit 15. A second input of the multiplexer 18 is connected to the output of the third flip-flop circuit 16. The selection input of the multiplexer 18 is connected to the output of the gate 17. The data input of the third flip-flop circuit 16 is connected to the data input terminal 11.

The clock signal generator gives an internal clock signal H' such that the frequency of this internal clock signal H' is higher than the highest frequency of the clock signal H1 or H2 arriving at the clock signal input terminal. A factor of 16 between the internal clock signal frequencies and the external clock signal frequencies gives very good results for the emulation on the logic emulator but has the drawback of considerably reducing the performance characteristics. For a transposition of technology, a factor of 4, for example, is used between the frequencies. This makes it possible to have appropriate frequencies of use.

In an integrated circuit or in an emulation of an integrated circuit, numerous flip-flop circuits are replaced by the emulation circuit 10. A single internal clock signal generator 19 is used for the entire emulation circuit.

The first flip-flop circuit 14 and the gate 17 define a synchronous pulse generator In the example shown, whenever a signal goes from a level "zero" to a level "one", a voltage square wave is produced at the output of the gate 17. This voltage square wave lasts less than one period of the internal clock signal. The voltage square wave is eliminated at the next active edge of the internal clock signal. The active edges of the signals arriving at the clock signal input terminal 13 are thus translated into validation windows with a duration of one period of the internal clock signal. It may be noted that glitches arriving at the clock signal input terminal 13 may have repercussions on the output of the gate 17 but have no effect on the validation of the data. In contrast, the exploiting phenomena of the signals which were non-overlapping with respect to the clock signals H1 and H2, become overlapping for the internal clock signal and are taken into account during a single cycle of the internal clock signal H'.

The output signal of the gate 17 controls the multiplexer 18. When the output signal of the gate 17 is at the level zero, the output of the multiplexer 18 produces the data present at its first input, namely the data already present in the second flip-flop circuit 15. In contrast, when the output signal of the gate 17 is at the level one, the output of the multiplexer 18 produces the data present at its second input, namely the data coming from the third flip-flop circuit 16. The third flip-flop circuit 16 has the effect of delaying the data by one cycle of the internal clock signal H'.

Figure 2:
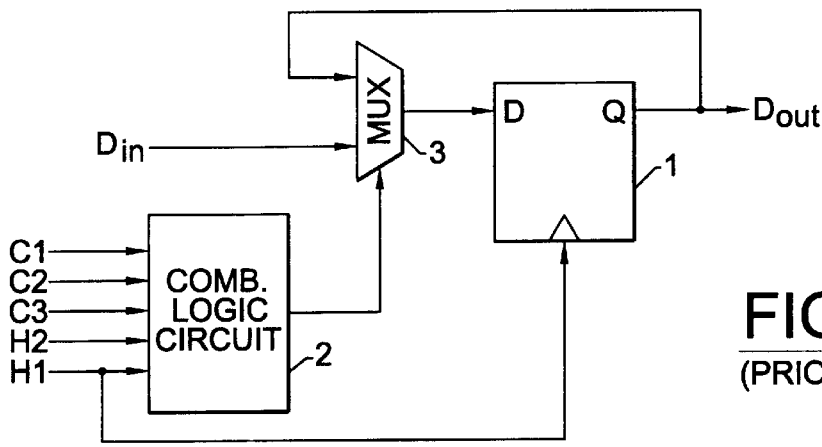
FIG. 2 is a diagram illustrating the use of the flip-flop circuit designed to replace the diagram of FIG. 1 according to the prior art.

As can be seen, the emulation circuit corresponds to the circuit of FIG. 2 in which there is carried out, firstly, an over-sampling of the clock signal and, secondly, a synchronous pulse generation on the validation signal. Those skilled in the art might believe that the pulse generator is unnecessary. However, if the pulse generator is removed, an update is carried out throughout the period when the signal reaching the clock signal input terminal is active. The update no longer corresponds to a specific update made during an active edge, and this may cause numerous problems.

Another source of problems has been observed in certain cases when a third flip-flop circuit 16 is not used. The use of the pulse generator serves to validate the data input of the second flip-flop circuit 15 during the next active edge of the internal clock signal H'. There is a lag which is at most equal to a period of the internal clock H' between the active edge to be considered and the active edge of the internal clock signal H' used. This lag is even smaller as the over-sampling is performed at a high frequency. Furthermore, conventionally, the updating of the data is done from the edge considered to be active. The lag created by the internal clock signal H' may cause the consideration of data that would have changed already if the update were to be done before the active edge of the internal clock signal H'. It is therefore preferable to delay the data by one cycle of the internal clock signal by the third flip-flop circuit 16.

Numerous variants of the emulation circuit 10 of FIG. 3 are possible The variants of the emulation circuit may depend on the technology used as well as on the type of the flip-flop circuit to be emulated. Many synchronous pulse generators are at the disposal of those skilled in the art. The first flip-flop circuit 14 and the gate 17 may be replaced by an equivalent circuit as a function of the particular requirements (whether the active edge to be detected is leading and/or trailing, inverted control logic of the inverter, etc.).

The assembly including the second flip-flop circuit 15 and the multiplexer 18 correspond to a flip-flop circuit of the type to be emulated, while further comprising a data validation input. The second flip-flop circuit will preferably be of the same type as the circuit to be emulated.

Figure 4:
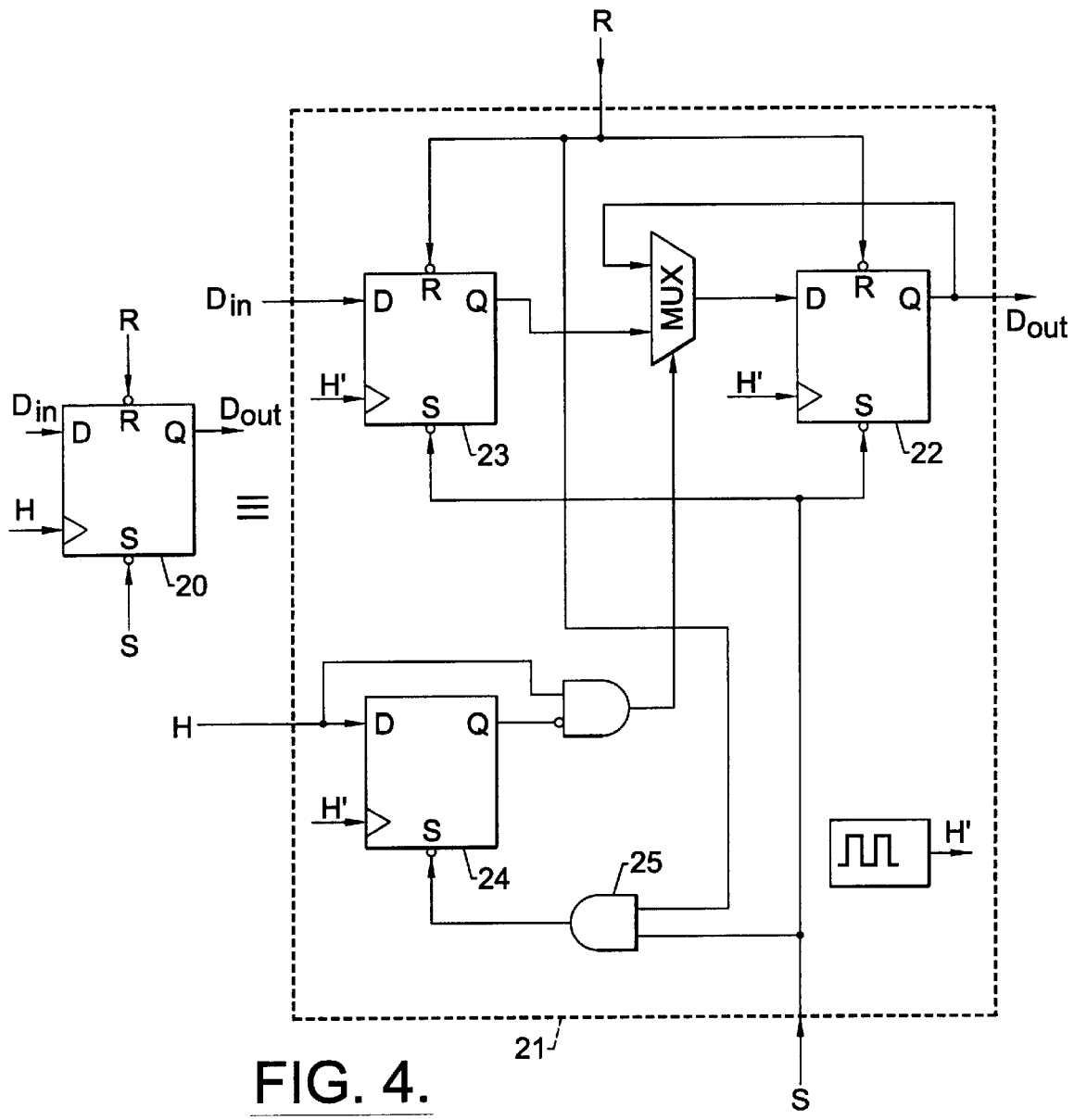
FIG. 4 shows an alternative embodiment of the invention.

FIG. 4 shows an alternative embodiment of the invention by which all types of flip-flop circuits can be defined. FIG. 4 shows a flip-flop circuit 20, for example a D type flip-flop circuit, with asynchronous "zero" setting and "one" setting inputs and a corresponding emulation circuit 21. The emulation circuit 21 is the same as the emulation circuit 10 of FIG. 3. However, the asynchronous setting inputs are connected firstly to the flip-flop circuit 22 of the same type as the flip-flop circuit 20 to be emulated and, secondly, to the D type flip-flop circuit 23 which delays the data. The zero setting or one setting of the D type flip-flop circuit 23 is necessary to prevent an automatic repeat switch-over if the zero setting or the one setting overlaps the period of the internal clock signal H' which validates the data. It is also appropriate to place the D type flip-flop circuit 24 of the synchronous pulse generator 24 at one in order to prevent a premature updating of the flip-flop circuit 22 of the same type as the flip-flop circuit 20 to be emulated. The one setting of the D type flip-flop circuit 24 is set by a logic gate 25, for example, an AND gate.

On the basis of the examples described, those skilled in the art can recreate all the types of existing flip-flop circuits. Other variants are possible without changing the object of the invention. In the present description, reference is made to leading active edges, active "zero" setting inputs and an active data validation at "one". All the combinations of active levels, at zero or at one, are possible, provided that the logic gates used are changed.

That which is claimed is:

1. A storage circuit for emulating a predetermined type of flip-flop circuit, the storage circuit comprising:

an internal clock signal generator for generating an internal clock signal;

a synchronous pulse generator for generating a synchronizing pulse during a period of the internal clock signal when an active edge is present in an external clock signal; and a first flip-flop circuit comprising a validation input connected to the synchronous pulse generator for validating data input during the synchronizing pulse.

2. A storage circuit according to claim 1, wherein the internal clock signal has a higher frequency than the external clock signal.

3. A storage circuit according to claim 1, further comprising at least one delay circuit for delaying input data by at least one internal clock signal period.

4. A storage circuit according to claim 3, further comprising at least one asynchronous setting input connected to the first flip-flop circuit and the least one delay circuit.

5. A storage circuit according to claim 1, wherein the synchronous pulse generator comprises:

a second flip-flop circuit for receiving the external clock signal; and at least one logic gate having a first input for receiving the external clock signal, and a second input connected to an output of the second flip-flop circuit.

6. A storage circuit according to claim 5, further comprising:

a third flip-flop circuit for delaying input data by at least one internal clock signal period; and a multiplexer having first and second data inputs, a selection input and an output, wherein the first data input is connected to the output of the first flip-flop circuit, the second data input is connected to an output of the third flip-flop circuit, the selection input is connected to an output of the at least one logic gate, and the output is connected to the validation input of the first flip-flop circuit.

7. A storage circuit for emulating a predetermined type of flip-flop circuit, the storage circuit comprising:

a combinational logic circuit for generating an external clock signal;

an internal clock signal generator for generating an internal clock signal;

a synchronous pulse generator for generating a synchronizing pulse during a period of the internal clock signal when an active edge is present in the external clock signal; and a first flip-flop circuit comprising a validation input connected to the synchronous pulse generator for validating data input during the synchronizing pulse.

8. A storage circuit according to claim 7, wherein the internal clock signal has a higher frequency than the external clock signal.

9. A storage circuit according to claim 7, further comprising at least one delay circuit for delaying input data by at least one internal clock signal period.

10. A storage circuit according to claim 9, further comprising at least one asynchronous setting input connected to the first flip-flop circuit and the least one delay circuit.

11. A storage circuit according to claim 7, wherein the synchronous pulse generator comprises:

a second flip-flop circuit for receiving the external clock signal; and at least one logic gate having a first input for receiving the external clock signal, and a second input connected to an output of the second flip-flop circuit.

12. A storage circuit according to claim 11, further comprising:

a third flip-flop circuit for delaying input data by at least one internal clock signal period; and a multiplexer having first and second data inputs, a selection input and an output, wherein the first data input is connected to the output of the first flip-flop circuit, the second data input is connected to an output of the third flip-flop circuit, the selection input is connected to an output of the at least one logic gate, and the output is connected to the validation input of the first flip-flop circuit.

13. An emulation circuit comprising:

an internal clock signal generator for generating an internal clock signal;

a synchronous pulse generator connected to the internal clock signal generator, for generating a synchronizing pulse; and a first circuit connected to the internal clock signal generator and to the synchronous pulse generator, for validating data input during the synchronizing pulse, said first circuit comprising a flip-flop circuit having a validation input connected to the synchronous pulse generator.

14. An emulation circuit according to claim 13, wherein the synchronous pulse generator is for generating the synchronizing pulse during a period of the internal clock signal when an active edge is present in an external clock signal.

15. An emulation circuit according to claim 13, wherein the internal clock signal has a higher frequency than the external clock signal.

16. An emulation circuit according to claim 13, further comprising at least one delay circuit for receiving input data, and connected to the internal clock signal generator, for delaying input data by at least one internal clock signal period.

17. An emulation circuit according to claim 16, further comprising at least one asynchronous setting input connected to the first circuit and the least one delay circuit.

18. An emulation circuit according to claim 13, further comprising:

at least one delay circuit connected to the internal clock signal generator; and a multiplexer connected to the first circuit, the at least one delay circuit, the synchronous pulse generator,, and a validation input of the first circuit.

19. An emulation circuit according to claim 18, wherein the at least one delay circuit comprises a flip-flop circuit.

20. An emulation circuit according to claim 13, wherein the synchronous pulse generator comprises:

a flip-flop circuit for receiving an external clock signal; and at least one logic gate having a first input for receiving the external clock signal, and a second input connected to an output of the flip-flop circuit.

21. An emulation circuit according to claim 20, further comprising a combinational logic circuit for generating the external clock signal.

22. A method of operating a data storage circuit comprising a data input, a data output, and a clock signal input, the method comprising the steps of:

generating an internal clock signal;

generating a pulse during a period of the internal clock signal whenever an active edge is present at an external clock signal received by the clock signal input;

validating an input signal received by the data input during the pulse;

storing data pertaining to the input signal received by the data input during the active edge of the external clock signal; and outputting a validated signal at the data output.

23. A method according to claim 22, further comprising the step of delaying the signal received by the data input by at least one internal clock signal period.

24. A method according to claim 22, wherein the internal clock signal has a higher frequency than the external clock signal.

* * * * *